(12) United States Patent
Batra et al.

(10) Patent No.: US 7,939,394 B2
(45) Date of Patent: May 10, 2011

(54) MULTIPLE-DEPTH STI TRENCHES IN INTEGRATED CIRCUIT FABRICATION

(75) Inventors: Shubneesh Batra, Boise, ID (US); Howard C. Kirsch, Eagle, ID (US); Gurtej S. Sandhu, Boise, ID (US); Xianfeng Zhou, Meridian, ID (US); Chih-Chen Cho, Starkville, MS (US)

(73) Assignee: Micron Technology, Inc., Boise, ID (US)

( * ) Notice: Subject to any disclaimer, the term of this patent is extended or adjusted under 35 U.S.C. 154(b) by 299 days.

(21) Appl. No.: 12/057,643

(22) Filed: Mar. 28, 2008

(65) Prior Publication Data

US 2008/0176378 A1 Jul. 24, 2008

Related U.S. Application Data

(62) Division of application No. 10/931,946, filed on Sep. 1, 2004, now Pat. No. 7,354,812.

(51) Int. Cl.
*H01L 21/336* (2006.01)
*H01L 21/8238* (2006.01)

(52) U.S. Cl. ......... 438/196; 438/207; 438/218; 438/219

(58) Field of Classification Search .................. 438/196, 438/207, 218, 219
See application file for complete search history.

(56) References Cited

U.S. PATENT DOCUMENTS

| | | |
|---|---|---|
| 4,609,934 A | 9/1986 | Haskell |
| 4,988,639 A | 1/1991 | Aomura |
| 5,179,038 A | 1/1993 | Kinney |
| 5,473,186 A | 12/1995 | Morita |
| 5,776,817 A | 7/1998 | Liang |
| 5,814,547 A | 9/1998 | Chang |
| 5,851,928 A | 12/1998 | Cripe |
| 6,175,144 B1 | 1/2001 | Gardner |
| 6,207,534 B1 | 3/2001 | Chan |
| 6,288,426 B1 | 9/2001 | Gauthier, Jr. |
| 6,294,419 B1 | 9/2001 | Brown |
| 6,294,423 B1 | 9/2001 | Malik |
| 6,596,608 B2 | 7/2003 | Saito |
| 6,737,706 B2 | 5/2004 | Lee |
| 6,815,734 B1 | 11/2004 | Horch |
| 6,864,152 B1 | 3/2005 | Mirbedini |
| 2001/0010938 A1 | 8/2001 | Bronner et al. |
| 2001/0036705 A1 | 11/2001 | Nishida |
| 2003/0080379 A1 | 5/2003 | Oikawa |
| 2004/0029385 A1 | 2/2004 | Manger |
| 2004/0092115 A1 | 5/2004 | Hsieh |
| 2004/0188796 A1 | 9/2004 | Karpov |

(Continued)

FOREIGN PATENT DOCUMENTS

EP 0 507 586 A2 10/1992

(Continued)

*Primary Examiner* — Matthew C Landau
*Assistant Examiner* — James M Mitchell
(74) *Attorney, Agent, or Firm* — Leffert Jay & Polglaze, P.A.

(57) ABSTRACT

Multiple trench depths within an integrated circuit device are formed by first forming trenches in a substrate to a first depth, but of varying widths. Formation of a dielectric layer can cause some of the trenches to fill or close off while leaving other, wider trenches open. Removal of a portion of the dielectric material can then be tailored to expose a bottom of the open trenches while leaving remaining trenches filled. Removal of exposed portions of the underlying substrate can then be used to selectively deepen the open trenches, which can subsequently be filled. Such methods can be used to form trenches of varying depths without the need for subsequent masking.

21 Claims, 12 Drawing Sheets

U.S. PATENT DOCUMENTS

| | | |
|---|---|---|
| 2005/0020028 A1 | 1/2005 | Liao et al. |
| 2005/0130378 A1 | 6/2005 | Huang |
| 2005/0221616 A1 | 10/2005 | Chen et al. |
| 2005/0250335 A1 | 11/2005 | Huang et al. |

FOREIGN PATENT DOCUMENTS

| | | |
|---|---|---|
| JP | 63144540 | 6/1998 |

US 7,939,394 B2

MULTIPLE-DEPTH STI TRENCHES IN INTEGRATED CIRCUIT FABRICATION

RELATED APPLICATION

This application is a divisional of U.S. application Ser. No. 10/931,946, titled "MULTIPLE-DEPTH STI TRENCES IN INTEGRATED CIRCUIT FABRICATION," filed Sep. 1, 2004, now U.S. Pat. No. 7,354,812 which is commonly assigned and incorporated herein by reference.

FIELD

The present invention relates generally to integrated circuit devices and, in particular, to the formation of multiple-depth STI (shallow trench isolation) trenches in an integrated circuit device.

BACKGROUND

Memory devices are typically provided as internal storage areas in the computer. The term memory identifies data storage that comes in the form of integrated circuit chips. In general, memory devices contain an array of memory cells for storing data, and row and column decoder circuits coupled to the array of memory cells for accessing the array of memory cells in response to an external address.

There are several different types of memory. One type is DRAM (dynamic random access memory). This is typically used as main memory in a computer environment. A DRAM memory cell is commonly configured as an access transistor coupled to a capacitor. A charge stored on the capacitor defines a data value of the memory cell. DRAM is generally volatile, which means that it requires a steady flow of electricity to maintain its contents. As soon as the power is turned off, whatever data was in DRAM is lost. However, it remains popular as it provides high memory density and quick access times.

Another type of memory is a non-volatile memory known as Flash memory. A flash memory is a type of EEPROM (electrically-erasable programmable read-only memory) that can be erased and reprogrammed in blocks. Many modern personal computers (PCs) have their BIOS stored on a flash memory chip so that it can easily be updated if necessary. Such a BIOS is sometimes called a flash BIOS. Flash memory is also popular in wireless electronic devices because it enables the manufacturer to support new communication protocols as they become standardized and to provide the ability to remotely upgrade the device for enhanced features.

A typical flash memory comprises a memory array that includes a large number of memory cells arranged in row and column fashion. Each of the memory cells includes a floating-gate field-effect transistor capable of holding a charge. The cells are usually grouped into blocks. Each of the cells within a block can be electrically programmed in a random basis by charging the floating gate. The charge can be removed from the floating gate by a block erase operation. The data in a cell is determined by the presence or absence of the charge in the floating gate.

Flash memory typically utilizes one of two basic architectures known as NOR flash and NAND flash. The designation is derived from the logic used to read the devices. In NOR flash architecture, a column of memory cells are coupled in parallel with each memory cell coupled to a bit line. In NAND flash architecture, a column of memory cells are coupled in series with only the first memory cell of the column coupled to a bit line.

Memory device fabricators, as well as other integrated circuit device fabricators, are continuously seeking to reduce the size of the devices. Smaller devices facilitate higher productivity and reduced power consumption. However, as device sizes become smaller, isolation within the devices becomes more critical. This is especially true in flash memory architecture because of the high voltages utilized on-chip.

Shallow trench isolation (STI) has been commonly used in semiconductor fabrication to provide field isolation. As devices are scaled ever smaller, and trenches become narrower, dielectric filling of the trenches becomes increasingly difficult. As a result, trench depth is often reduced to lower the aspect ratio of the trench, thereby making it easier to fill. However, field isolation between active areas in the periphery often requires that a certain trench depth be maintained.

For the reasons stated above, and for other reasons stated below which will become apparent to those skilled in the art upon reading and understanding the present specification, there is a need in the art for alternate methods of providing isolation within a semiconductor device.

DETAILED DESCRIPTION OF THE INVENTION

In the following detailed description of the preferred embodiments, reference is made to the accompanying drawings that form a part hereof, and in which is shown by way of illustration specific embodiments in which the inventions may be practiced. These embodiments are described in sufficient detail to enable those skilled in the art to practice the invention, and it is to be understood that other embodiments may be utilized and that process or mechanical changes may be made without departing from the scope of the present invention. The terms wafer and substrate used previously and in the following description include any base semiconductor structure. Both are to be understood as including silicon-on-sapphire (SOS) technology, silicon-on-insulator (SOI) technology, thin film transistor (TFT) technology, doped and undoped semiconductors, epitaxial layers of silicon supported by a base semiconductor, as well as other semiconductor structures well known to one skilled in the art. Furthermore, when reference is made to a wafer or substrate in the following description, previous process steps may have been utilized to form regions/junctions in the base semiconductor structure. The following detailed description is, therefore, not to be taken in a limiting sense, and the scope of the present invention is defined only by the appended claims and their equivalents.

Figure 1A:
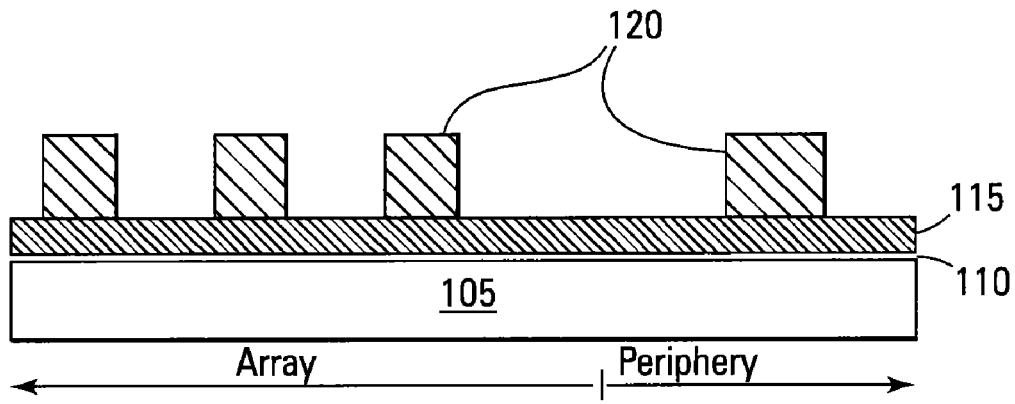
FIGS. 1A-1G are cross-sectional views of a portion of an integrated circuit during various stages of fabrication in accordance with an embodiment of the invention.

FIGS. 1A-1G generally depict a method of forming a portion of an integrated circuit in accordance with an embodiment of the invention. While the process will be described with specific reference to a semiconductor memory device, it will be apparent that the methods described herein are suitable for a variety of integrated circuit devices. FIG. 1A depicts a portion of the memory array after several processing steps have occurred. In general, FIG. 1A depicts a semiconductor substrate 105 for use in fabricating a semiconductor device. For one embodiment, substrate 105 is a P-type monocrystalline silicon substrate. One or more sacrificial layers, such as first sacrificial layer 110 and second sacrificial layer 115 are formed overlying the substrate 105. These layers will be used to protect portions of the underlying substrate 105 during formation of trenches. For one embodiment, the first sacrificial layer 110 is silicon oxide ($SiO_2$) and the second sacrificial layer 115 is silicon nitride ($Si_3N_4$). For such an embodiment, the first sacrificial layer 110 might be formed by thermal oxidation of the silicon substrate 105 while the second sacrificial layer 115 might be formed by blanket deposition of a silicon nitride layer. Further guidance on selection of materials for the sacrificial layers will be provided with reference to subsequent processing.

A mask layer 120 is formed overlying the second sacrificial layer 115. The mask layer 120 defines areas for formation of trenches, i.e., the exposed areas of second sacrificial layer 115. As one example, the mask layer 120 is a patterned photoresist layer. Masking in semiconductor fabrication is well understood and will not be detailed herein.

Figure 1B:
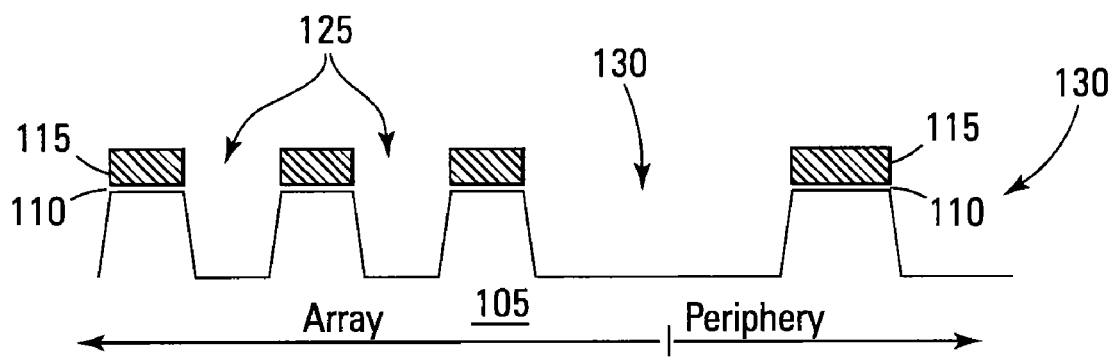

In FIG. 1B, first isolation trenches 125 and second isolation trenches 130 are formed in the substrate 105. For one embodiment, the trenches 125 and 130 are formed using a plasma etch. However, any anisotropic etch may be utilized to remove exposed portions of the sacrificial layers 110 and 115 and portions of the underlying substrate 105.

The trenches 125 and 130 are formed to substantially the same depth as they are formed concurrently. However, the first isolation trenches 125 are narrower than the second isolation trenches 130. In application, the first isolation trenches 125 might be used where narrow spacing is preferred and where field isolation is less demanding. As one example, this may include an array portion of a semiconductor memory device. Also, in application, the second isolation trenches 130 might be used where field isolation is more demanding and where spacing is less critical. As one example, this may include a periphery portion of the semiconductor memory device.

Figure 1C:
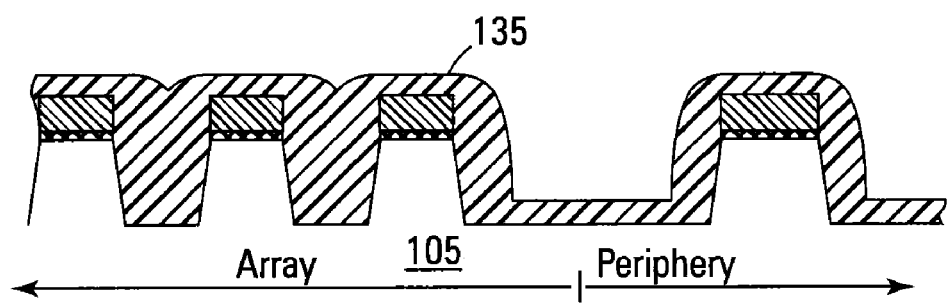

In FIG. 1C, a first dielectric fill layer 135 is formed. The first dielectric fill layer can include any dielectric material. Some specific examples include silicon oxides (SiO or $SiO_2$) using high-density plasma (HDP) processing or chemical-vapor deposition (CVD) processing to blanket deposit the first dielectric fill layer 135. The first dielectric fill layer 135 should be chosen such that a subsequent removal process is selective to the dielectric material of the first dielectric fill layer 135 over the uppermost sacrificial layer, i.e., second sacrificial layer 115 in this example. In other words, the first dielectric fill layer 135 should be of a different material than the second sacrificial layer 115 such that portions of the first dielectric fill layer 135 can be removed without significantly affecting the second sacrificial layer 115.

The first dielectric fill layer 135 should be deposited to a degree that closes off the narrower first isolation trenches 125 while leaving the second isolation trenches 130 open. It is noted that the first isolation trenches 125 do not have to be uniform in width, but simply must be of a width that will be filled upon formation of the first dielectric fill layer 135. Similarly, the second isolation trenches 130 do not have to be uniform in width, but simply must be of a width that will remain open after formation of the first dielectric fill layer 135. As such, the first isolation trenches 125 are those having a width less than some nominal value while the second isolation trenches 130 are those having a width above that nominal value.

Figure 1D:
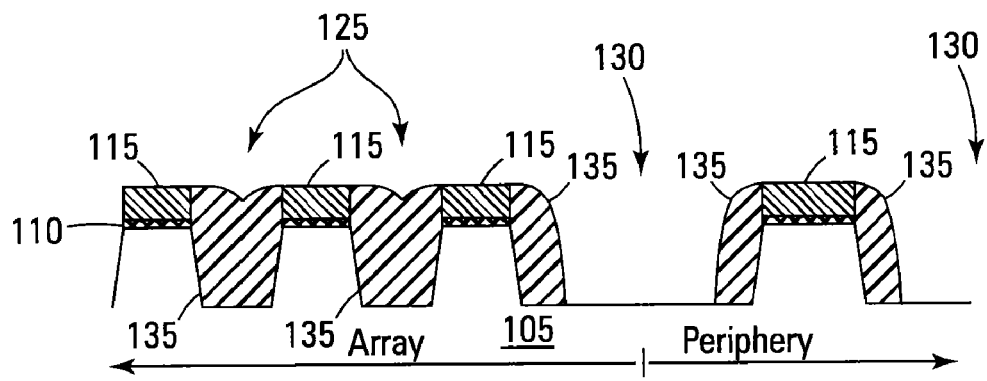

In FIG. 1D, portions of the first dielectric fill layer 135 are removed to expose portions of the substrate 105 in the bottoms of the second isolation trenches 130. By using an etch-back process or an anisotropic removal process, horizontal portions of the first dielectric fill layer 135 may be preferentially removed, thus leaving sidewalls of the isolation trenches 130 covered. This will allow the exposure of portions of the substrate 105 without substantially removing dielectric material from the first isolation trenches 125.

Figure 1E:
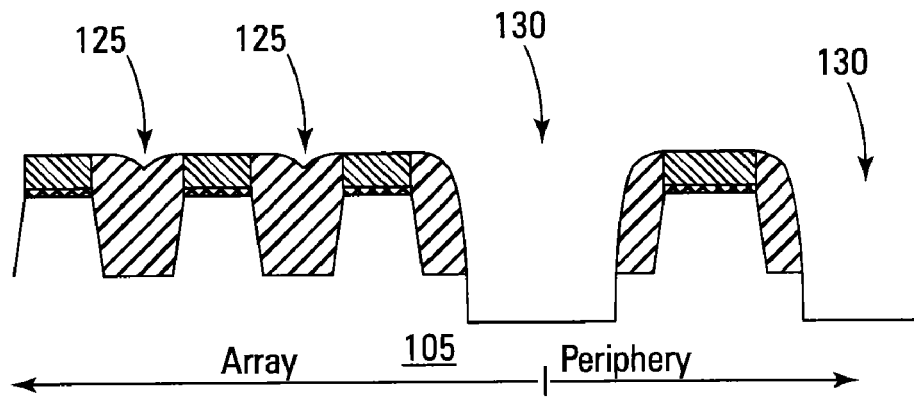

In FIG. 1E, second isolation trenches 130 are deepened. This result can be obtained by using a removal process selective to the material of the substrate 105 over the materials of the second sacrificial layer 115 and the first dielectric fill layer 135. For example, an anisotropic silicon etch can be used to remove exposed portions of a silicon substrate 105 without substantially affecting the exposed portions of the first dielectric fill layer 135 or the second sacrificial layer 115. Following the deepening of the second isolation trenches 130, portions of the first dielectric fill layer 135 on sidewalls of the second isolation trenches 130 may optionally be removed, such as by a wet etch or other removal process.

Figure 1F:
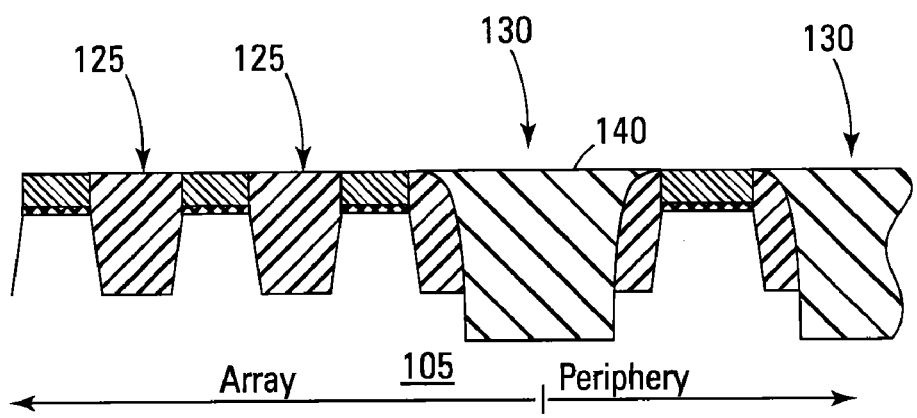

In FIG. 1F, a second dielectric fill layer 140 is formed. To obtain the structure of FIG. 1F, portions of the second dielectric fill layer 140 have been removed, such as by chemical-mechanical planarization (CMP) using the second sacrificial layer 115 as a stopping layer.

Figure 1G:
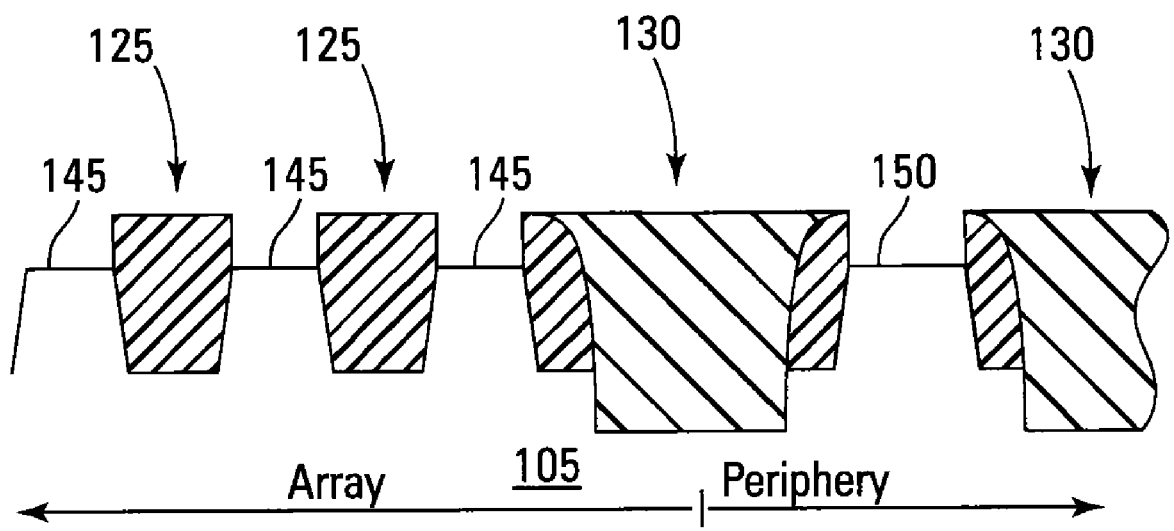

In FIG. 1G, the sacrificial layers 110 and 115 may then be removed, and formation of the integrated circuit device can proceed on active areas 145 and 150 as is well understood in the art of semiconductor fabrication. For example, portions of the integrated circuit device having higher requirements for isolation may be formed on active areas 150 that are isolated from adjacent active areas by a second isolation trench 130 while portions of the integrated circuit device having lower requirements for isolation may be formed on active areas 145 that are isolated from adjacent active areas by a first isolation trench 125. As a specific example, memory cells could be formed on active areas 145 between first isolation trenches 125 while access and control circuitry could be formed on active areas 150 between, or isolated from the array of memory cells by, second isolation trenches 130.

Although the foregoing example provided just two depths for the isolation trenches, it is noted that more than two depths can be formed using methods in accordance with the invention. For example, first isolation trenches could be formed having a first width that will close up upon formation of the first dielectric fill layer, second isolation trenches could be formed having a second width that will close up upon formation of the second dielectric fill layer, and third isolation trenches could be formed having a third width that will remain open after formation of the second dielectric fill layer. By performing processing similar to that described with reference to FIGS. 1E-1F, it will become apparent that a third isolation trench depth could be formed for the third isolation trenches. Through the use of varying trench widths, any number of trench depths could be produced. However, deeper trenches will correspondingly be wider when formed in this manner.

Figure 4A:
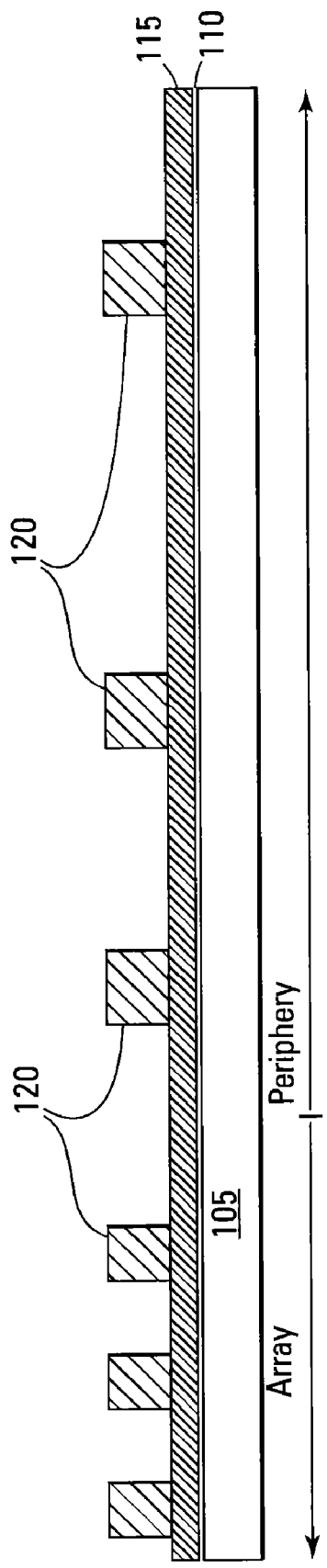
FIGS. 4A-4J are cross-sectional views of a portion of an integrated circuit during various stages of fabrication in accordance with another embodiment of the invention.

FIGS. 4A-4J are cross-sectional views depicting a processing method, similar to that described with reference to FIGS. 1A-1G, of forming a portion of an integrated circuit having the third isolation trenches. Common numbering is used in FIGS. 4A-4J and FIGS. 1A-1G to denote common elements. Such commonly numbered elements are described above in conjunction with FIGS. 1A-1G. The structure of FIG. 4A is similar to the structure of FIG. 1A, with the exception of the substrate 105 having a third area for future third isolation trenches, and is substantially formed as described above in conjunction with FIG. 1A.

Figure 4B:
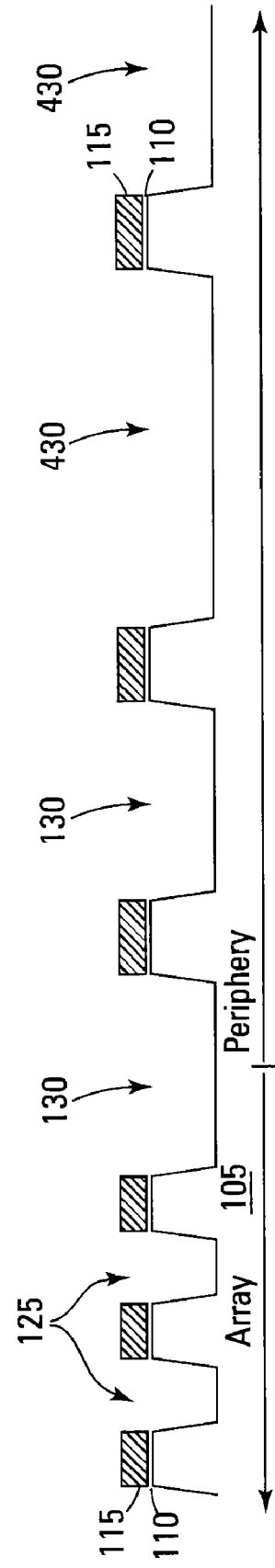
Figure 4C:
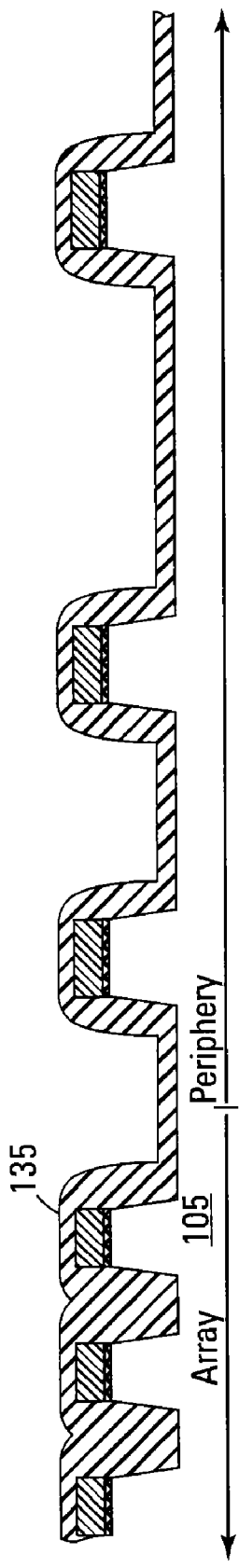
Figure 4D:
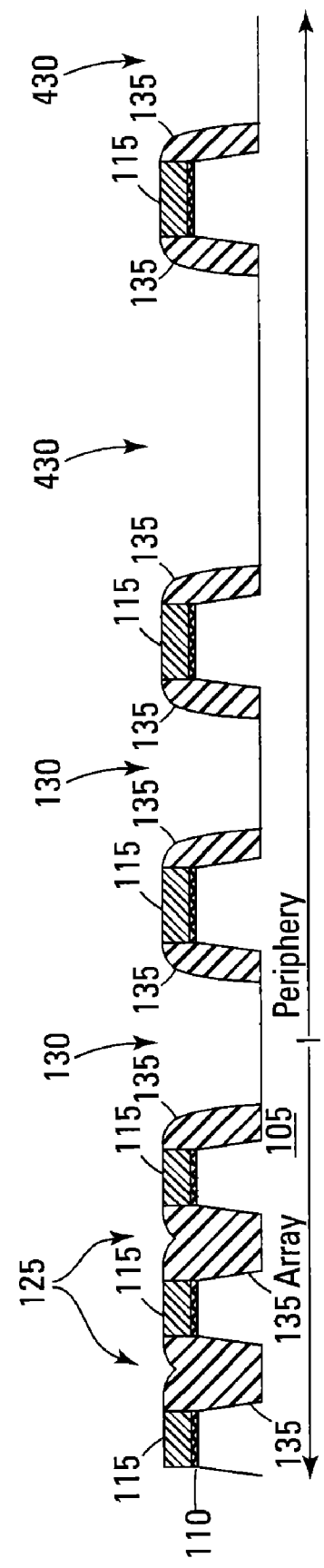
Figure 4E:
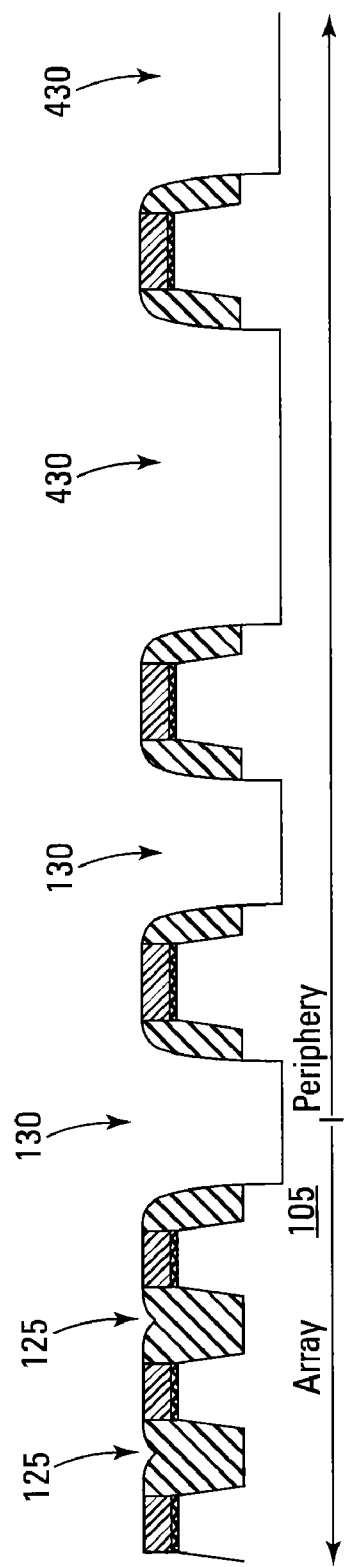

A plurality of trenches is formed in FIG. 4B to a first depth in substrate 105. The plurality of trenches includes first trenches 125 having a width less than some first value, second trenches 130 having a width greater than the first value and less than a second value, and third trenches 430 having a width greater than the second value. A first dielectric layer 135 is formed overlying the substrate 105 to fill the first trenches 125 and to leave open the second trenches 130 and the third trenches 430, as shown in FIG. 4C. A portion of the first dielectric layer 135 is removed in FIG. 4D to expose portions of the underlying substrate 105 at bottoms of the second trenches 130 and of the third trenches 430 while leaving the first trenches 125 filled. Exposed portions of the underlying substrate 105 are removed to extend the second trenches 130 and the third trenches 430 to a second depth in FIG. 4E.

Figure 4F:
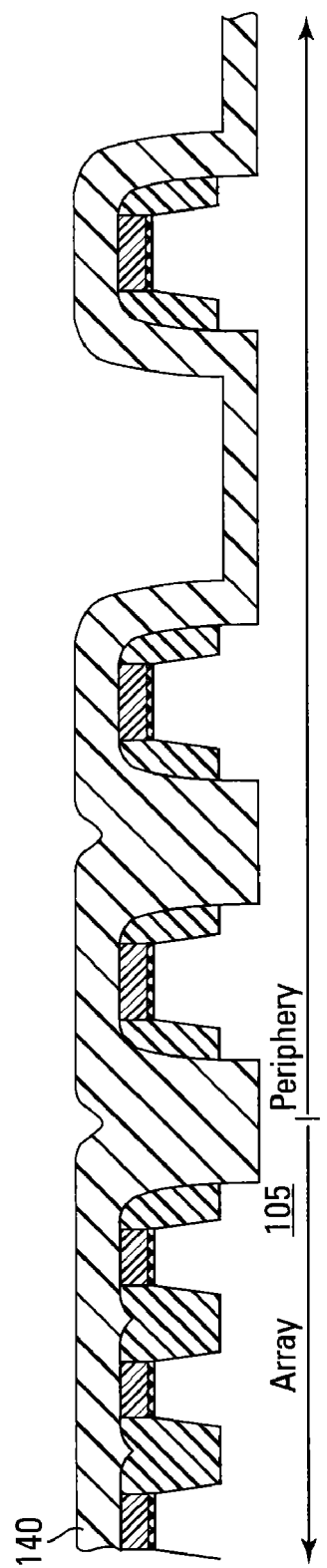
Figure 4G:
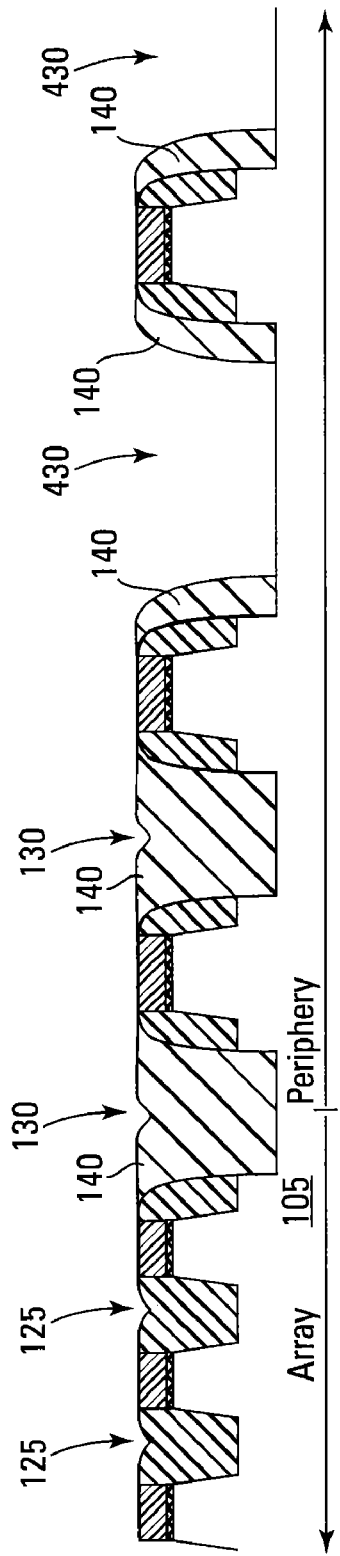
Figure 4H:
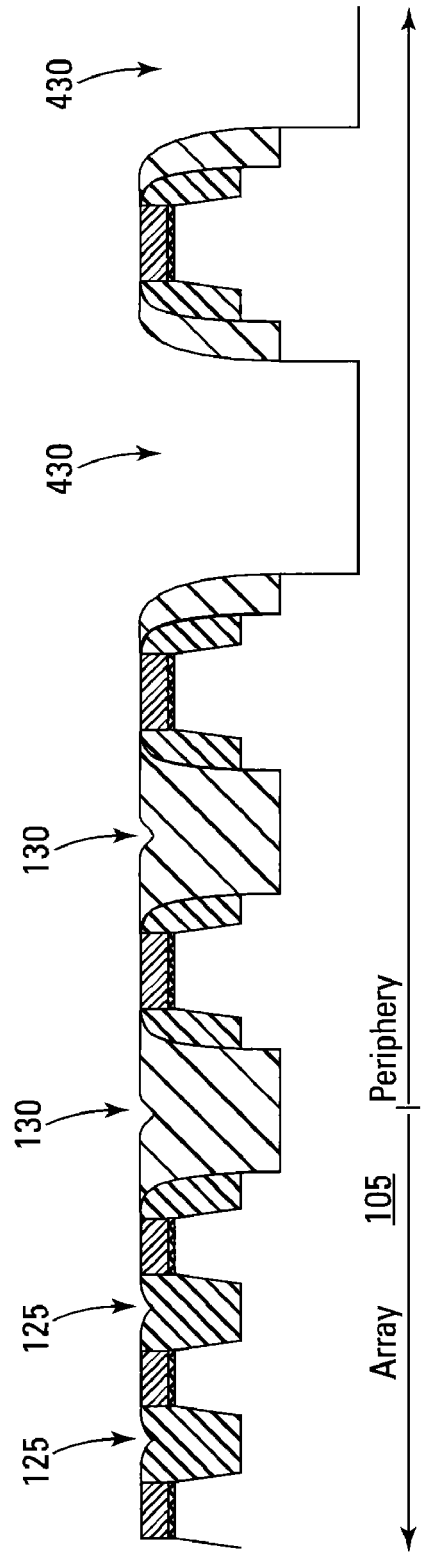
Figure 4I:
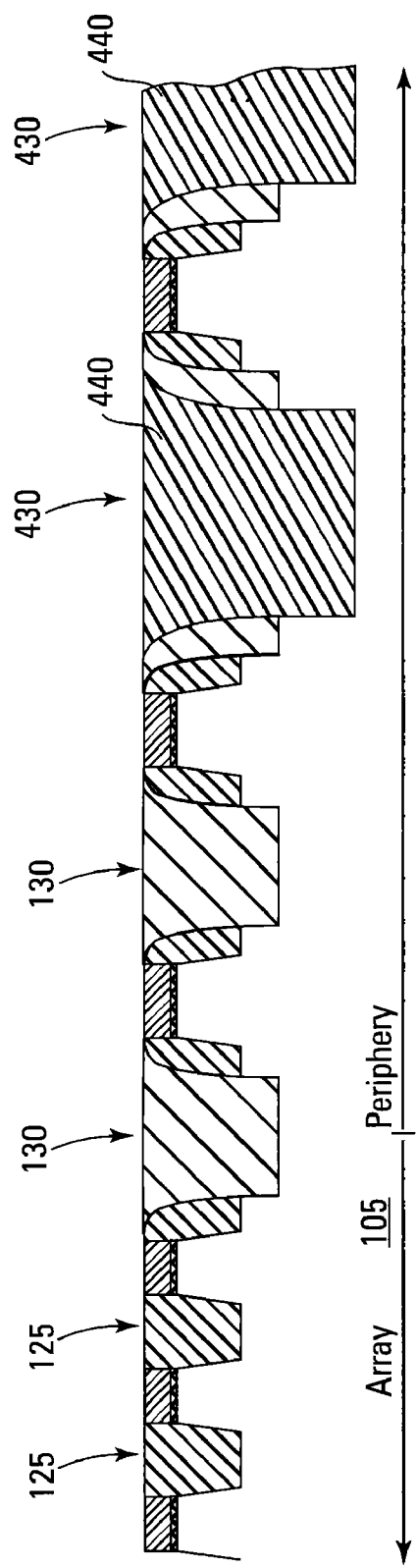

In FIG. 4F, a second dielectric layer 140 is formed overlying the substrate 105 to fill the second trenches 130 and to leave open the third trenches 430. A portion of the second dielectric layer 140 is removed in FIG. 4G to expose portions of the underlying substrate 105 at the bottoms of the third trenches 430 while leaving the first trenches 125 and the second trenches 130 filled. Exposed portions of the underlying substrate 105 are removed to extend the third trenches 430 to a third depth in FIG. 4H.

Figure 4J:
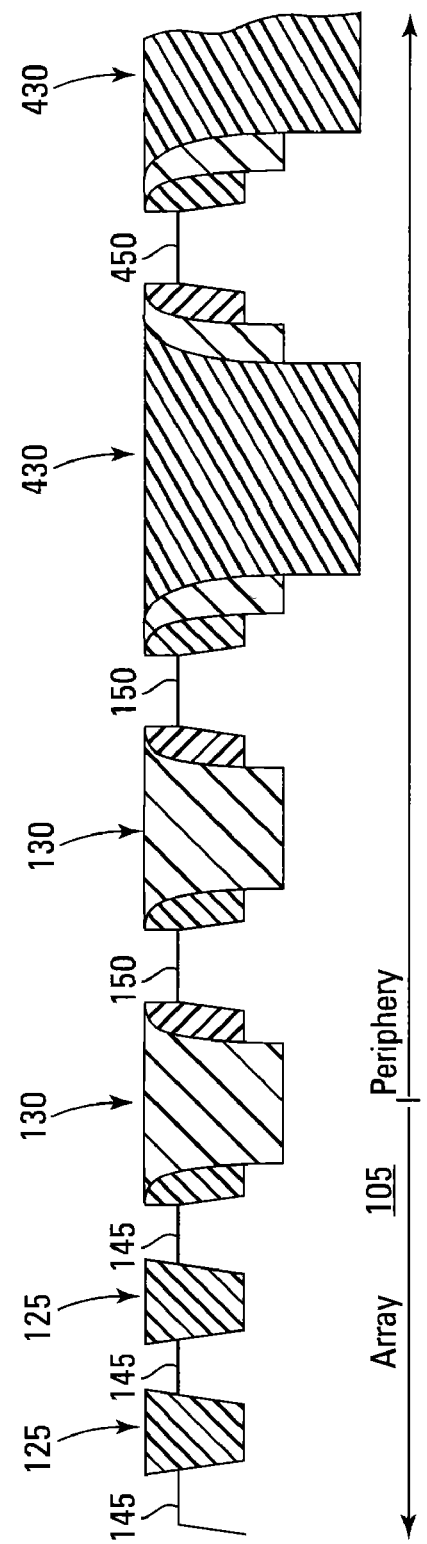

A third dielectric layer 440 is formed overlying the substrate to fill the third trenches 430. A portion of the third dielectric layer 440 is removed to expose portions of sacrificial layer 115 to obtain the structure of FIG. 4I. In FIG. 4J, the sacrificial layers 110 and 115 are removed to expose active areas 145, 150, and 450 of the substrate, as discussed above in conjunction with FIG. 1G. The integrated circuit device is then formed on active areas 145, 150, and 450, as is well understood in the art of semiconductor fabrication.

Figure 1H:
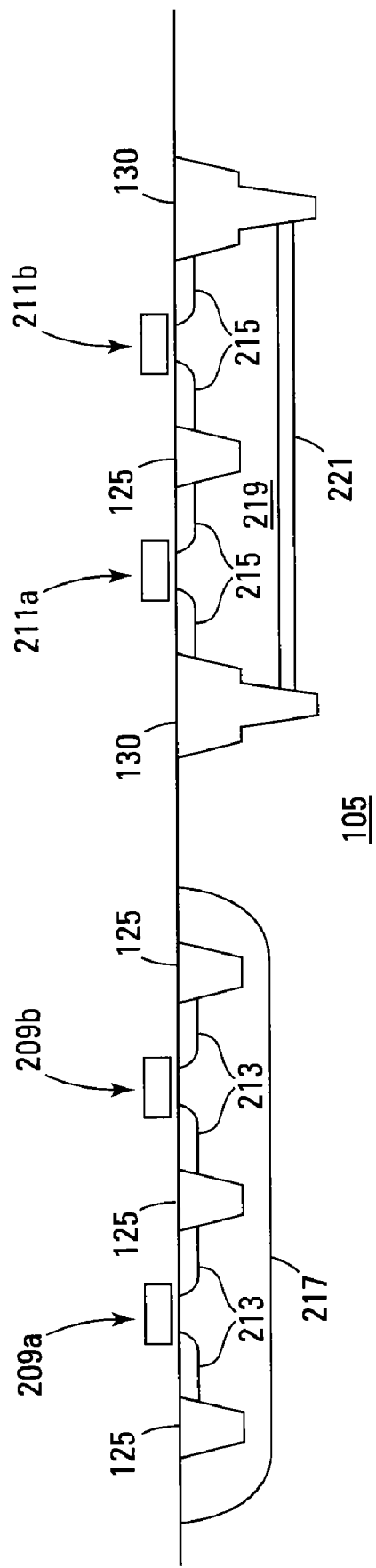
FIG. 1H is a cross-sectional view of a portion of an integrated circuit illustrating use of multiple-depth isolation trenches in accordance with an embodiment of the invention.

FIG. 1H is a cross-sectional view of a portion of an integrated circuit illustrating use of multiple-depth isolation trenches in accordance with an embodiment of the invention. As shown in FIG. 1H, the integrated circuit is formed in a substrate 105. For the following example, it will be assumed that the substrate 105 is a P-type substrate. However, the invention is not limited to a specific conductivity type. In this example, component devices of a first type, such as p-type field effect transistors (pFETs) 209a and 209b are formed in an n-well 217. The pFETs 209a and 209b have source/drain regions 213 having p$^+$ conductivity. The pFETs 209a and 209b are isolated from one another by one or more first isolation regions 125. To further this example, component devices having a second conductivity type, such as n-type field effect transistors (nFETs) 211a and 211b are formed in an isolated p-well 219. The nFETs 211a and 211b have source/drain regions 215 having n$^+$ conductivity. The nFETs 211a and 211b are isolated from one another, and any adjacent nFETs in p-well 219, by one or more first isolation regions 125. The p-well 219 is isolated from the bulk of the P-type substrate using a deep N+ region 221 and one or more of the second isolation regions 130. Similarly, the p-well 219 is isolated from any adjacent n-wells, such as n-well 217, by one or more of the second isolation regions 130. As described with reference to FIGS. 1A-1G, the second isolation regions 130 are deeper than the first isolation regions 125.

It is noted that the isolation regions 125 and 130 may be formed as open trenches (trenches having two or more ends), closed trenches (trenches forming a closed loop of regular or irregular shape) or some combination of the two. For example, isolation regions 130 in FIG. 1H could represent a closed polygon, completely enclosing the N+ region 221 while isolation regions 125 could represent straight lines between rows of FETs 209 and 211. It will be apparent that multiple trench depths can be used in a variety of ways and that the foregoing example illustrates just one possible configuration. Similarly, other well structures could be used in conjunction with the isolation techniques described herein, such as triple well structures well known in the art. By forming isolation trenches in accordance with embodiments of the inventions, performance benefits, e.g., sensitivity, noise rejection, low voltage capability, etc., can be facilitated without the disadvantages of typical large inter-well design rule spacing.

Figure 2A:
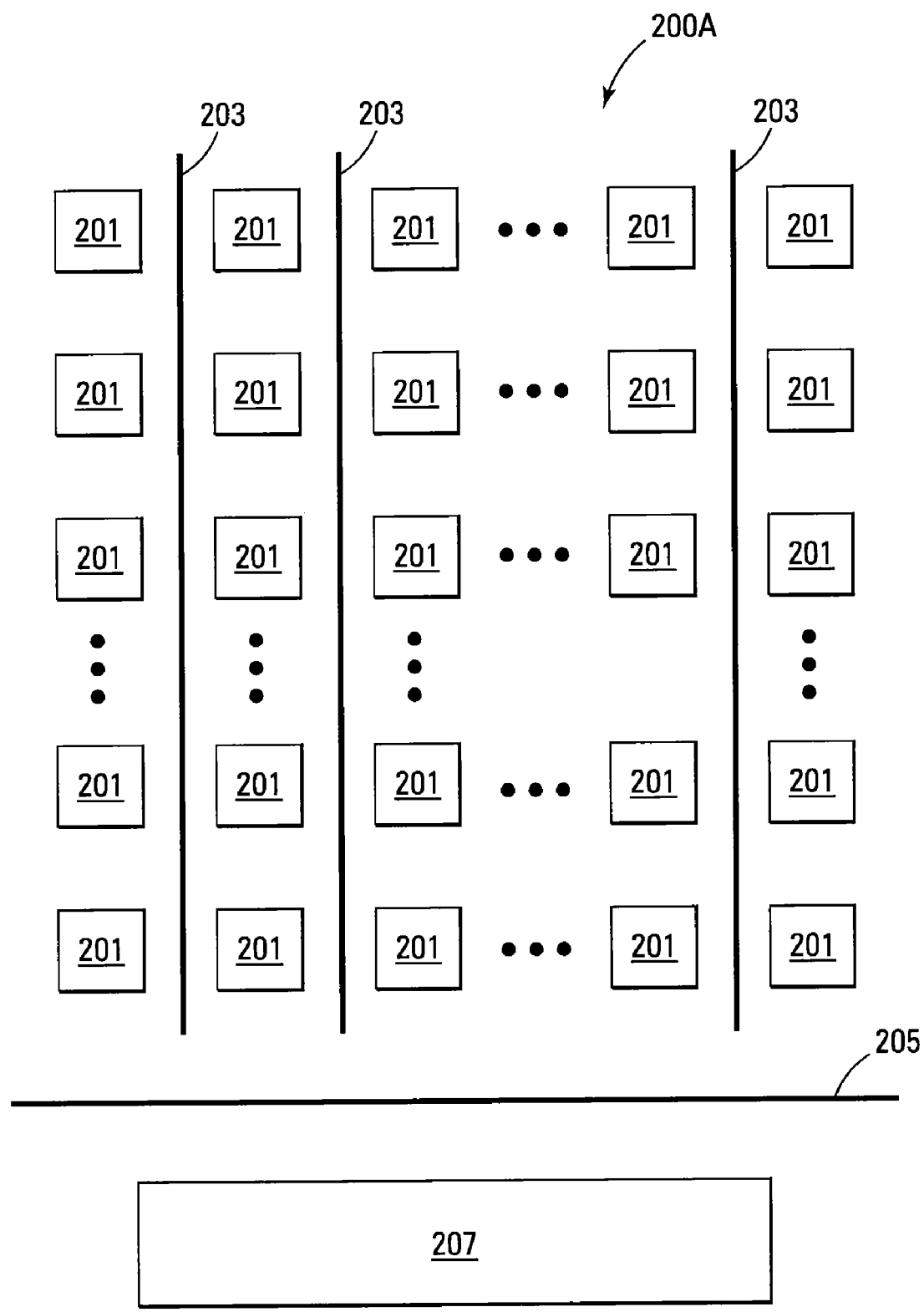
FIG. 2A is a block schematic of a portion of a memory array and peripheral circuitry in accordance with an embodiment of the invention.

FIG. 2A is a block diagram of a portion of a memory array 200A and peripheral circuitry 207 as a portion of a memory device in accordance with one embodiment of the invention. The memory array 200A can represent a volatile or nonvolatile memory array and is provided to show generally how multiple-depth isolation trenches may be used in a typical integrated circuit device. The memory array 200A includes memory cells 201 arranged generally in row and column fashion. As discussed, field isolation needs may vary within an integrated circuit device. For the example memory array 200A, shallow trenches 203 may be used to isolate adjacent rows or columns of memory cells 201 while deeper trenches 205 may be used to isolate the array of memory cells 201 from access and control circuitry 207.

Figure 2B:
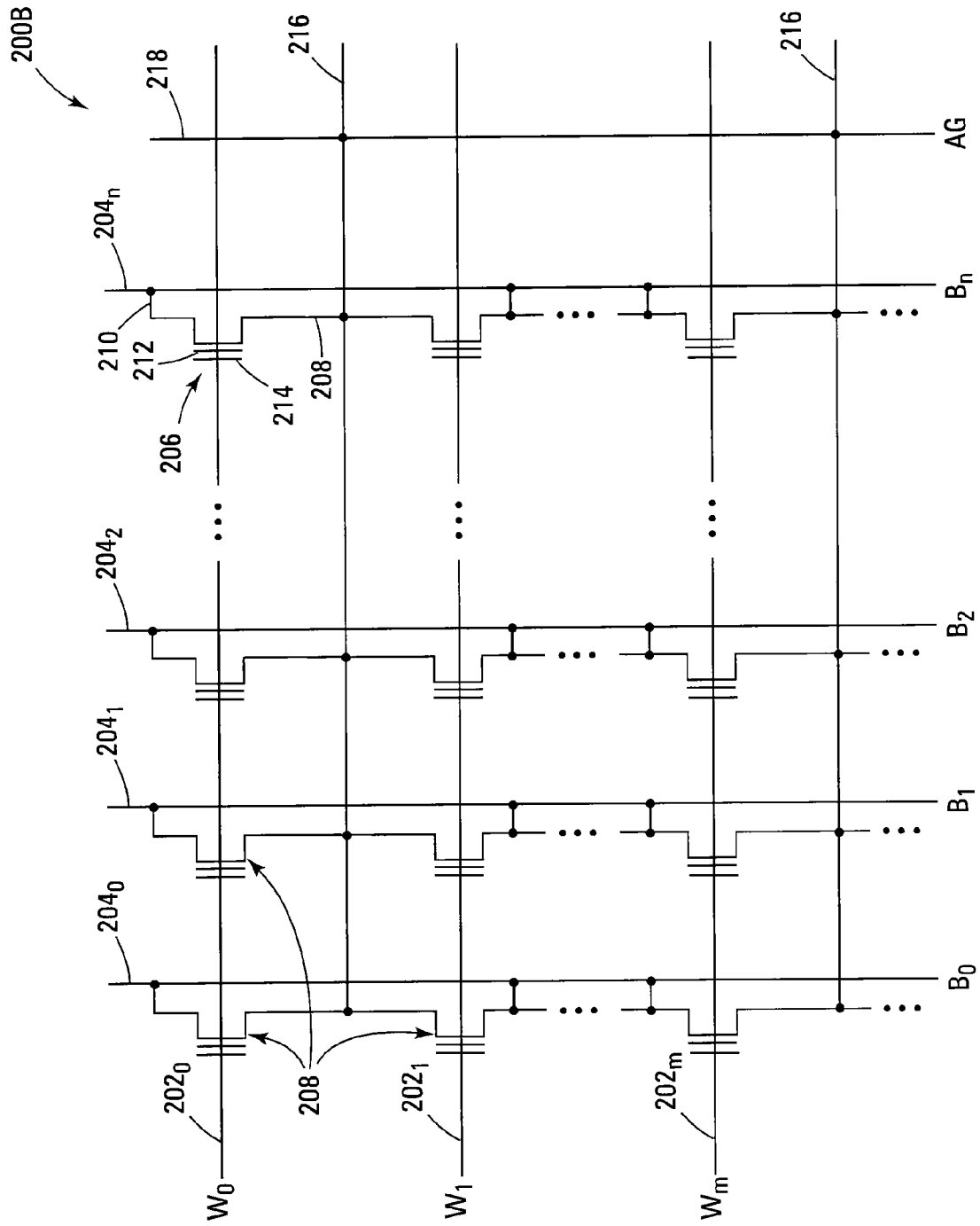
FIG. 2B is a schematic of a portion of a non-volatile memory array in accordance with a further embodiment of the invention.

FIG. 2B is a schematic of a portion of a nonvolatile memory array 200B as a portion of a memory device in accordance with one embodiment of the invention. The detail of memory array 200B is provided to better understand the various embodiments of the invention. The memory array 200B includes at least two types of isolation trenches formed in accordance with an embodiment of the invention. A first type of isolation trench may, for example, isolate adjacent rows or columns of memory cells while a second type of isolation trench may be located at a periphery of the array for isolation of the array from surrounding circuitry. A memory array represents just one application for use of the multiple-depth isolation trenches.

The layout of FIG. 2B corresponds to one example of a NOR flash architecture. However, other types of memory arrays can benefit from embodiments of the invention. As one example, word lines, drain contacts and source interconnects can be fabricated in accordance with the invention for NAND flash architectures as well, although only one drain contact is required per string and only one source interconnect is required per block. Accordingly, the invention is not limited to the specific layout described with reference to FIG. 2B.

As shown in FIG. 2B, the memory block 200B includes word lines 202 and intersecting local bit lines 204. For ease of addressing in the digital environment, the number of word lines 202 and the number of bit lines 204 are each some power of two, e.g., 256 word lines 202 by 4,096 bit lines 204. The local bit lines 204 may be selectively coupled to global bit lines (not shown) for coupling to sense amplifiers (not shown in FIG. 2B).

Floating-gate transistors 206 are located at each intersection of a word line 202 and a local bit line 204. The floating-gate transistors 206 represent the non-volatile memory cells for storage of data. Typical construction of such floating-gate transistors 206 include a source 208 and a drain 210 constructed from an $n^+$-type material of high impurity concentration formed in a P-type semiconductor substrate of low impurity concentration, a channel region formed between the source and drain, a floating gate 212, and a control gate 214. Floating gate 212 is isolated from the channel region by a tunneling dielectric and from the control gate 214 by an intergate dielectric. Floating-gate transistors 206 having their control gates 214 coupled to a word line 202 typically share a common source 208 depicted as array source interconnect 216. As shown in FIG. 2B, floating-gate transistors 206 coupled to two adjacent word lines 202 may share the same array source interconnect 216. Floating-gate transistors 206 have their drains coupled to a local bit line 204. A column of the floating-gate transistors 206 are those transistors commonly coupled to a given local bit line 204. A row of the floating-gate transistors 206 are those transistors commonly coupled to a given word line 202.

The array source interconnects 216 may be coupled to a metal or other highly conductive line to provide a shared path to a ground potential node. The array ground 218 serves as this shared path. For one embodiment, a connection between an array source interconnect 216 and the array ground 218 occurs only once for each row of memory cells 206. Typical memory devices may make require a contact between an array source interconnect and an array ground every 16 columns.

Figure 3:
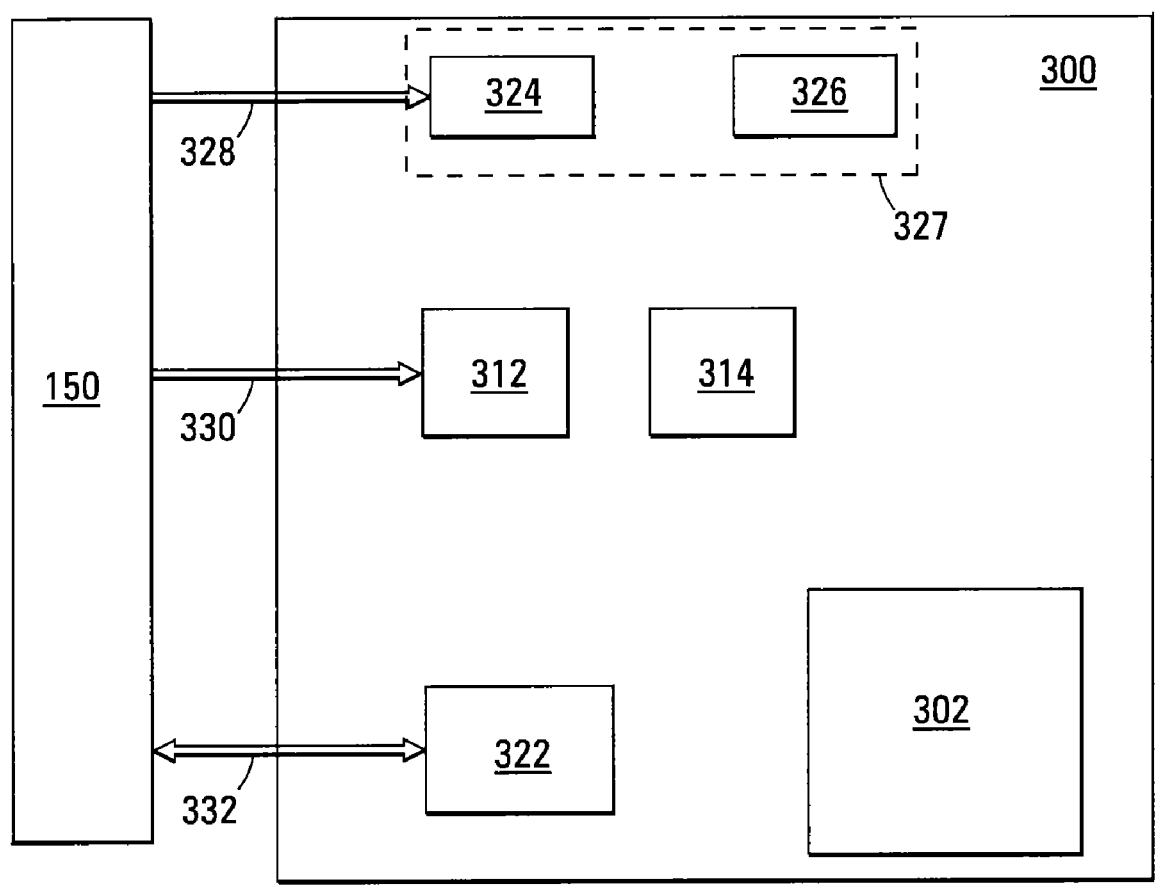
FIG. 3 is a functional block diagram of a basic memory device in accordance with an embodiment of the invention coupled to a processor.

FIG. 3 is a block diagram of a memory device 300 coupled to a controller or processor 150 in accordance with an embodiment of the invention. The memory type of the memory device 300 is not dependent upon the invention and can include a variety of volatile or non-volatile memory types. Memory device 300 includes a memory array 302 having a plurality of memory cells arranged in row and column fashion. The memory device 300 includes first isolation trenches, such as shallow isolation trenches, within the memory array 302 and second isolation trenches, such as deeper isolation trenches, at a periphery of the memory array 302 and formed in accordance with an embodiment of the invention.

Memory array 302 can be accessed using externally provided location addresses received by an address register 312 via address signal connections 330. The address signals are decoded, and one or more target memory cells are selected in response to the decoded address signals, using the access circuitry 314 that includes decode and select circuitry.

Data is input and output through an I/O circuit 322 via data connections 332. I/O circuit 322 includes data output registers, output drivers, and output buffers. Command execution logic 324 is provided to control the basic operations of the memory device 300 in response to control signals received via control signal connections 328. A state machine 326 may also be provided to control specific operations performed on the memory array 302 and the memory cells. The command execution logic 324 and/or state machine 326 can be generally referred to as control circuitry 327 to control read, write, erase, and other memory operations. The data connections 332 are typically used for bidirectional data communication. The memory can be coupled to an external processor 150 for operation as part of an electronic system. An example of a processor 150 includes a memory controller in a personal computer.

It will be appreciated by those skilled in the art that additional circuitry and control signals can be provided, and that the memory device of FIG. 3 has been simplified to help focus on the invention. It will further be understood that the above description of a memory device is intended to provide a general understanding of the memory and is not a complete description of all the elements and features of a typical memory device.

CONCLUSION

Method and apparatus have been described to facilitate formation of multiple trench depths within an integrated circuit device by first forming trenches in a substrate to a first depth, but of varying widths. Formation of a dielectric layer can cause some of the trenches to fill or close off while leaving other, wider trenches open. Removal of a portion of the dielectric material can then be tailored to expose a bottom of the open trenches while leaving remaining trenches filled. Removal of exposed portions of the underlying substrate can then be used to selectively deepen the open trenches, which can subsequently be filled. Such methods can be used to form trenches of varying depths without the need for subsequent masking.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention. It is manifestly intended that this invention be limited only by the following claims and equivalents thereof.

What is claimed is:

1. A method of fabricating trenches within an integrated circuit device, comprising:
    forming a plurality of trenches in a substrate to a first depth, wherein the plurality of trenches includes first isolation trenches having a width less than some nominal value and second isolation trenches having a width greater than the nominal value;
    forming a first dielectric layer overlying the substrate to fill the first isolation trenches and to leave open the second isolation trenches;
    removing a portion of the first dielectric layer to expose portions of the underlying substrate at bottoms of the second isolation trenches while leaving the first isolation trenches filled;
    removing exposed portions of the underlying substrate to extend the second isolation trenches to a second depth; and
    forming a second dielectric layer overlying the substrate to fill the second isolation trenches;
    wherein the first dielectric layer and the second dielectric layer comprise the same dielectric material.

2. The method of claim 1, wherein forming a plurality of trenches in a substrate to a first depth further comprises:
    forming at least one sacrificial layer overlying the substrate;
    forming a mask layer overlying the at least one sacrificial layer, thereby defining exposed portions of the at least one sacrificial layer; and removing the exposed portions of the at least one sacrificial layer and underlying portions of the substrate.

3. The method of claim 2, further comprising:
removing a portion of the second dielectric layer to expose remaining portions of the at least one sacrificial layer;
removing the remaining portions of the at least one sacrificial layer to expose active areas of the substrate; and
fabricating the integrated circuit device on the active areas of the substrate.

4. The method of claim 2, wherein forming at least one sacrificial layer overlying the substrate comprises forming a first sacrificial layer overlying the substrate and a second sacrificial layer overlying the first sacrificial layer, the first and second sacrificial layers being of different materials.

5. The method of claim 1, wherein removing a portion of the first dielectric layer further comprises preferentially removing horizontal portions of the first dielectric layer.

6. The method of claim 5, wherein preferentially removing horizontal portions of the first dielectric layer leaves sidewalls of the second isolation trenches covered with the first dielectric layer.

7. The method of claim 6, wherein forming a second dielectric layer overlying the substrate to fill the second isolation trenches further comprises forming the second dielectric layer overlying the first dielectric layer covering the sidewalls of the second isolation trenches.

8. The method of claim 1, wherein the plurality of trenches further includes third trenches having a width sufficient to remain open after forming the second dielectric layer.

9. A method of fabricating isolation trenches of varying depth within an integrated circuit device, the method comprising:
defining areas of a substrate for future trenches, wherein a first area has a first width and a second area has a second width wider than the first width;
forming a first trench in the first area of the substrate and a second trench in the second area of the substrate;
forming a first dielectric fill layer overlying the substrate to fill the first trench and to leave the second trench open;
removing a portion of the first dielectric fill layer to expose a portion of the substrate at a bottom of the second trench;
extending the second trench into the exposed portion of the substrate; and
forming a second dielectric fill layer overlying the substrate to fill the second trench;
wherein the first dielectric fill layer and the second dielectric fill layer comprise the same dielectric material.

10. The method of claim 9, wherein defining areas of the substrate for future trenches further comprises:
forming at least one sacrificial layer overlying the substrate; and
forming a mask layer overlying the at least one sacrificial layer to expose areas of the at least one sacrificial layer.

11. The method of claim 10, wherein forming at least one sacrificial layer further comprises forming at least one sacrificial layer comprising a material different than a material of the first dielectric fill layer.

12. The method of claim 10, wherein forming a mask layer further comprises forming and patterning a photoresist layer.

13. The method of claim 9, wherein forming a first trench in the first area of the substrate and forming a second trench in the second area of the substrate occur concurrently.

14. The method of claim 13, wherein the first trench and the second trench have substantially the same depth as initially formed.

15. The method of claim 9, wherein removing a portion of the first dielectric fill layer further comprises anisotropically removing a portion of the first dielectric layer.

16. The method of claim 9, further comprising:
defining a third area of the substrate for future trenches, wherein the third area, has a third width wider than the second width.

17. The method of claim 9, further comprising:
removing a second portion of the first dielectric fill layer from sidewalls of the second trench prior to forming the second dielectric fill layer overlying the substrate to fill the second trench.

18. A method of fabricating trenches within an integrated circuit device, comprising:
forming a plurality of trenches in a substrate to a first depth, wherein the plurality of trenches includes first trenches having a width less than some first value, second trenches having a width greater than the first value and less than a second value, and third trenches having a width greater than the second value;
forming a first dielectric layer overlying the substrate to fill the first trenches and to leave open the second and third trenches;
removing a portion of the first dielectric layer to expose portions of the underlying substrate at bottoms of the second and third trenches while leaving the first trenches filled;
removing exposed portions of the underlying substrate to extend the second and third trenches to a second depth;
forming a second dielectric layer overlying the substrate to fill the second trenches and to leave open the third trenches;
removing a portion of the second dielectric layer to expose portions of the underlying substrate at the bottoms of the third trenches while leaving the first and second trenches filled;
removing exposed portions of the underlying substrate to extend the third trenches to a third depth; and
forming a third dielectric layer overlying the substrate to fill the third trenches;
wherein the first dielectric layer and the second dielectric layer comprise the same dielectric material.

19. The method of claim 18, wherein forming a plurality of trenches in a substrate to a first depth further comprises:
forming at least one sacrificial layer overlying the substrate;
forming a mask layer overlying the at least one sacrificial layer, thereby defining exposed portions of the at least one sacrificial layer; and
removing the exposed portions of the at least one sacrificial layer and underlying portions of the substrate.

20. The method of claim 19, further comprising:
removing a portion of the third dielectric layer to expose remaining portions of the at least one sacrificial layer;
removing the remaining portions of the at least one sacrificial layer to expose active areas of the substrate; and
fabricating the integrated circuit device on the active areas of the substrate.

21. The method of claim 18, wherein removing a portion of the first dielectric layer further comprises anisotropically removing a portion of the first dielectric layer.

* * * * *

UNITED STATES PATENT AND TRADEMARK OFFICE
CERTIFICATE OF CORRECTION

| | |
|---|---|
| PATENT NO. | : 7,939,394 B2 |
| APPLICATION NO. | : 12/057643 |
| DATED | : May 10, 2011 |
| INVENTOR(S) | : Shubneesh Batra et al. |

It is certified that error appears in the above-identified patent and that said Letters Patent is hereby corrected as shown below:

In column 1, line 7, delete "TRENCES" and insert -- TRENCHES --, therefor.

Signed and Sealed this
Twelfth Day of July, 2011

David J. Kappos
*Director of the United States Patent and Trademark Office*